(12) United States Patent
Azadeh et al.

(10) Patent No.: US 8,670,473 B2
(45) Date of Patent: Mar. 11, 2014

(54) CIRCUIT AND METHOD FOR LIMITING CURRENT TO PREVENT ROLL-OVER IN LASER DIODES

(75) Inventors: Mohammad Azadeh, Northridge, CA (US); Todd Rope, Glendale, CA (US); Mark Heimbuch, Chatsworth, CA (US)

(73) Assignee: Source Photonics, Inc., Chatsworth, CA (US)

( * ) Notice: Subject to any disclaimer, the term of this patent is extended or adjusted under 35 U.S.C. 154(b) by 172 days.

(21) Appl. No.: 13/341,675

(22) Filed: Dec. 30, 2011

(65) Prior Publication Data

US 2013/0148680 A1 Jun. 13, 2013

(30) Foreign Application Priority Data

Dec. 8, 2011 (CN) .......................... 2011 1 0406437

(51) Int. Cl.
*H01S 5/042* (2006.01)
*H01S 5/068* (2006.01)

(52) U.S. Cl.
USPC ..................................... 372/38.07; 372/38.01

(58) Field of Classification Search
USPC ................................ 372/38.01, 38.02, 38.07
See application file for complete search history.

(56) References Cited

U.S. PATENT DOCUMENTS

2006/0274796 A1* 12/2006 Cheng et al. .............. 372/29.021
2007/0133634 A1* 6/2007 Lee et al. .................... 372/38.04

FOREIGN PATENT DOCUMENTS

CN 1389963 A 1/2003

OTHER PUBLICATIONS

Chinese Office Action dated Aug. 31, 2012; Chinese Patent Application No. 201110406437.1; 4 pages; The State Intellectual Property Office of the P.R.C., Peoples Republic of China.
Ma Jun, Tang Kuangping and He Deyi; "Aging and Screening Equipment and Method of Semiconductor Laser"; Espacenet; Chinese Publication No. CN 1389963 (A); Publication Date: Jan. 8, 2003; Espacenet Database—Worldwide; http://worldwide.espacenet.com/.

* cited by examiner

*Primary Examiner* — Jessica Stultz
*Assistant Examiner* — Michael Carter
(74) *Attorney, Agent, or Firm* — Andrew D. Fortney

(57) ABSTRACT

The present disclosure relates to an optical power monitoring circuit including an automatic power control (APC) loop and a microcontroller unit (MCU), and a method for monitoring the same. The APC loop comprises a laser diode (LD) and a feedback loop to maintain a laser optical power. The MCU is configured to (i) monitor a bias current using a current sense circuit, (ii) monitor a rate of change of the bias current with time, and (iii) adjust a target power of the APC loop. By monitoring the bias current and the rate of change, and comparing them against thresholds, the target power can be adjusted by the MCU, to prevent roll-over in the laser diode, damage to the laser, and/or a hard failure in the data links that use the laser.

22 Claims, 4 Drawing Sheets

CIRCUIT AND METHOD FOR LIMITING CURRENT TO PREVENT ROLL-OVER IN LASER DIODES

CROSS REFERENCE TO RELATED APPLICATION

This application claims the benefit of Chinese Patent Application No. 201110406437.1, which was filed on Dec. 8, 2011, and is hereby incorporated by reference as if fully set forth herein.

FIELD OF THE INVENTION

The present invention generally relates to the field of fiber optic communications and optical power control and/or monitoring circuits. More specifically, embodiments of the present invention pertain to an optical power monitoring circuit comprising an automatic power control (APC) loop and a microcontroller unit (MCU), and methods of manufacturing such optical power monitoring circuit.

DISCUSSION OF THE BACKGROUND

Generally, a laser diode (LD) provides relatively good monochromaticity and directionality, relatively smaller sizes and/or dimensions, and high usage of optical power. However, the environment has a significant impact on the output optical power from conventional laser diodes.

FIG. 1 shows the relation curve of an output power ($P_o$) and a positive driving current (I) for a typical semiconductor laser at various temperatures ($T_1$, $T_2$). The bottom portions of the temperature curves are raised above the x-axis for ease of illustration. As shown in FIG. 1, if a driving current (I) is below a threshold value ($I_{th}$), the laser can only emit fluorescence, and the output optical power ($P_o$) has a value of approximately zero mW. Typically, a laser lases when the driving current (I) is above the threshold current ($I_{th}$), and the output optical power ($P_o$) linearly rises with the increase of the working current. Therefore, in order to make a laser diode lase, the working current (I) provided to the laser diode must be higher than the threshold current ($I_{th}$).

Referring to FIG. 1, the threshold current ($I_{th}$) is affected by temperature ($T_1$, $T_2$). Generally, $T_1$ is less than $T_2$. Thus, the higher the temperature ($T_1$, $T_2$), the higher the threshold current ($I_{th}$). With the rise of the temperature ($T_1$, $T_2$), the threshold current ($I_{th}$) of the laser diode (LD) increases and the slope efficiency decreases.

To compensate for the variation in the threshold value ($I_{th}$) and to stabilize the optical power ($P_o$), an automatic power control (APC) circuit 200 is applied, as shown in FIG. 2. FIG. 2 shows a typical circuit embodying an APC 200 that monitors the back illumination of a laser diode (LD) 203, detects the current of a photoelectric diode (PD) 202, and stabilizes the photo-generated current of the photoelectric diode (PD) 202 by adjusting a bias current 201 to the laser diode 203. A modulation current 220 is injected into the circuit 200. The bias current 201 produced by transistor 213 is isolated from the modulation current by an inductor 204.

However, with the rise of temperature, the threshold current ($I_{th}$) increases, the slope (S) efficiency of the laser decreases, and subsequently the direct bias current (IBIAS) 201 of the APC circuit 200 increases, which may lead to thermal runaway situations and/or lasers shutting down. Ultimately, this can cause a hard failure of the system and damage to the system's hardware.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

The present invention relates to an optical power monitoring circuit comprising an automatic power control (APC) loop and a microcontroller unit (MCU). The present optical power monitoring circuit advantageously integrates the MCU to monitor a bias current and a rate of change of the bias current with time. In order to overcome the shortcomings in existing technology, the present optical power monitoring circuit and monitoring method advantageously maintain an output optical power and prevent thermal runaway situations and/or laser diodes from rolling over and/or shutting down, which can result in a hard failure and/or shutdown of the system and/or cause damage to the system's hardware.

The APC loop comprises a laser diode (LD) and a power monitoring feedback loop including an integral amplifier. The laser diode is connected to a current sense circuit. The MCU is configured to (i) monitor a bias current (IBIAS) using the current sense circuit, (ii) monitor a rate of change of the bias current with time, and (iii) adjust a target power of the APC loop. In accordance with the optical power control circuit of the present invention, by monitoring the bias current and its rate of change, and comparing the data against two threshold currents and two threshold rates of change, the target power can be adjusted by the MCU, to prevent the laser diode from rolling over and resulting in a hard shutdown, which can damage the laser and cause a hard failure in the data links that utilize that particular laser.

According to one embodiment of the present invention, the target power is decreased when the bias current (IBIAS) to the laser diode or the rate of change of the bias current with time exceeds an alarm threshold ($I_{ALM}$ or $dI/dt_{ALM}$). The target power is increased when the bias current (IBIAS) or the rate of change of the bias current with time is lower than the warning threshold ($I_{WRN}$ or $dI/dt_{WRN}$). The $I_{ALM}$ is the absolute maximum current at which the laser is allowed to operate in a particular application, and the $I_{WRN}$ is the current below which the laser can operate normally in a given application.

According to another embodiment of the present invention, the alarm threshold current $I_{ALM}$ is configured to be lower than (or to approach) the maximum current in the common operation mode of the laser diodes. For example, the alarm threshold $I_{ALM}$ may be about 90-100 mA. In various embodiments, the warning threshold current is 85-100 mA, or approximately 2-20 mA lower than the alarm threshold $I_{ALM}$. In addition, the alarm threshold rate $dI/dt_{ALM}$ may be about 2-20 mA/minute, and the warning threshold rate $dI/dt_{WRN}$ may be about (−2)-(−20) mA/minute.

Furthermore, the APC loop includes various forms of circuitry that can embody the APC, and is not limited to the APC circuit of FIG. 2.

Relative to conventional technology, the APC circuit of the present invention advantageously monitors the bias current and evaluates the bias current compared to two threshold currents. Subsequently, the present APC circuit adjusts the target power via the MCU, so that the laser is prevented from rolling over and causing a hard shutdown. Thus, the APC circuit of the present invention advantageously prevents damage to the laser and/or a hard failure in the data links using that particular laser.

These and other advantages of the present invention will become readily apparent from the detailed description of various embodiments below.

DETAILED DESCRIPTION

Reference will now be made in detail to various embodiments of the invention, examples of which are illustrated in the accompanying drawings. In order to achieve the objectives, technical solutions and advantages of the present invention more clearly, further details of the invention are described below with regard to the Figures. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention. The embodiments described here are only used to explain, rather than limit, the invention.

For the sake of convenience and simplicity, the terms "photoelectric diode" and "photodiode" are generally used interchangeably herein, but are generally given their art-recognized meanings In addition, the terms "laser output power," "optical output power," and "output optical power" are generally used interchangeably herein, but are generally given their art-recognized meanings Furthermore, for convenience and simplicity, the terms "optical signal" and "light" may be used interchangeably, as may the terms "connected to," "coupled with," "coupled to," and "in communication with" (which terms also refer to direct and/or indirect relationships between the connected, coupled and/or communicating elements unless the context of the term's use unambiguously indicates otherwise), but these terms are also generally given their art-recognized meanings Furthermore, all characteristics, measures or processes disclosed in this document, except characteristics and/or processes that are mutually exclusive, can be combined in any manner and in any combination possible. Any characteristic disclosed in the present specification, claims, Abstract and/or figures can be replaced by other equivalent characteristics or characteristics with similar objectives, purposes and/or functions, unless specified otherwise. Each characteristic is generally only an embodiment of the invention disclosed herein.

Figure 3:
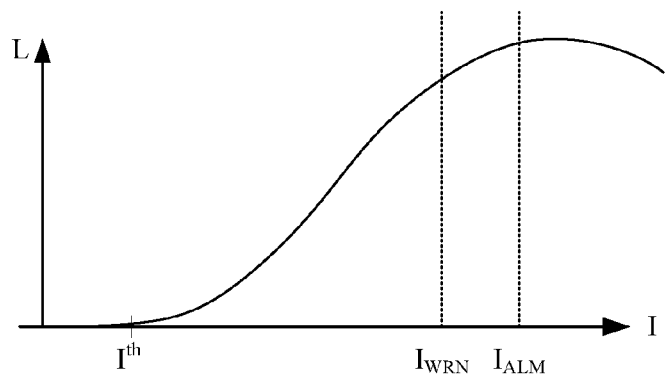
FIG. 3 is a graph showing a LI curve (e.g., optical output and/or power [L] as a function of current [I]) of a laser diode, including the roll-over of the optical power at very high currents.

FIG. 3 is a diagram showing a LI curve (e.g., optical output and/or power [L] as a function of current [I]) of a laser diode. In the LI curve, $I_{th}$ represents a minimum current at which the laser outputs light. An alarm threshold $I_{ALM}$ is the maximum current at which the laser is permitted to operate in a particular application (e.g., a predetermined "maximum allowable bias current"). If the $I_{ALM}$ is reached, the optical power output ($P_o$) of the laser diode decreases due to damage to the laser diode or the start of a different operation (e.g., power down or shut down). The warning threshold $I_{WRN}$ is the current below which the laser operates normally in a given application. Thus, the $I_{WRN}$ is the maximum current at which the target optical power can be obtained during the process in which the laser cools down.

Referring to FIG. 3, a roll-over (or decrease of laser output power as the bias current increases) occurs at high currents. If a bias current (IBIAS) goes above the $I_{ALM}$, the optical power of the laser diode decreases. There is a possibility that the laser may fall into a thermal run-away situation caused by either high current or high temperature when implementing conventional APC circuits. For example, the APC tries to compensate for the lower laser output power by increasing the bias current, causing the laser to become even hotter and/or causing the laser to roll-over further, thus further decreasing laser output power. As a result, the APC attempts to increase the bias current even more, but the optical power goes down even further. This feedback loop causes the current to increase to the maximum level that the circuit can provide, causing the circuit to shut-down and possibly damaging the laser.

Figure 1:
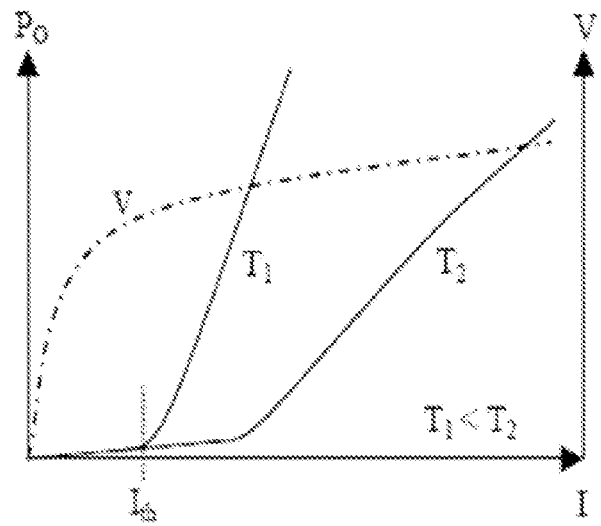
FIG. 1 is a graph showing a relation curve of an output power (L) and a positive driving current (I) for a conventional semiconductor laser at different temperatures.
Figure 2:
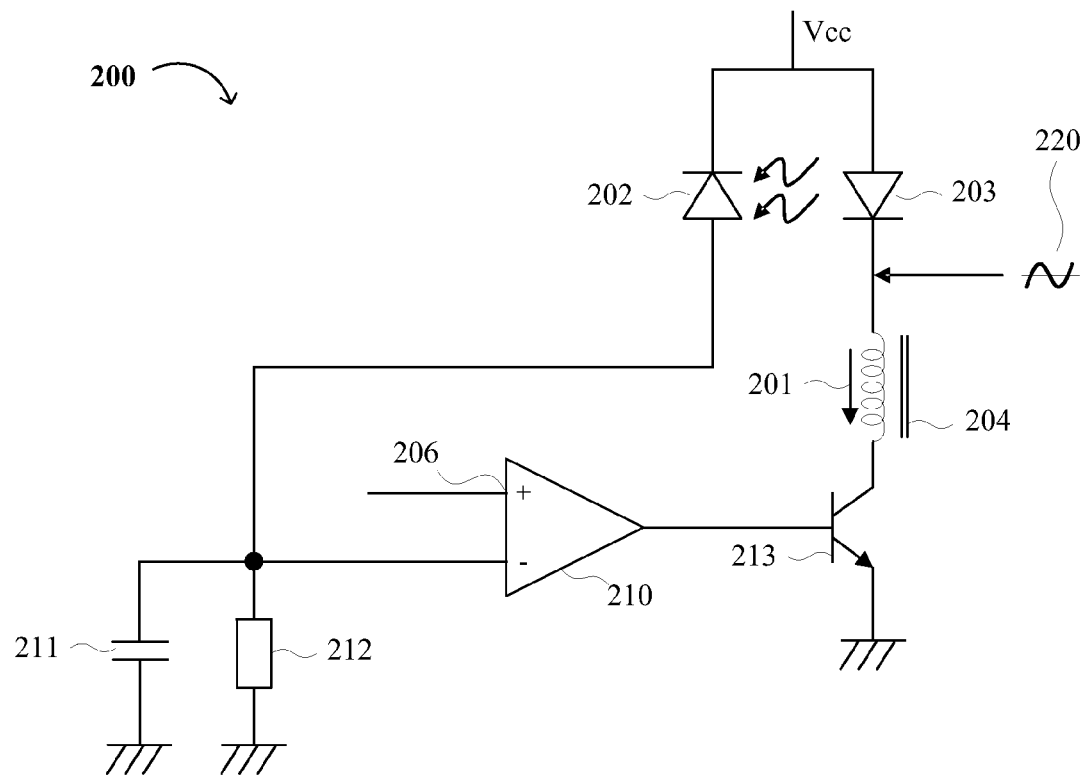
FIG. 2 is a diagram showing a circuit for implementing automatic power control (APC).

To avoid causing the current to increase to the maximum level, which causes the circuit to shut-down and possibly damages the laser, a second control layer including a current sense circuit and a microcontroller unit (MCU) are added to an APC loop (e.g., the APC loop of FIG. 2).

Figure 4:
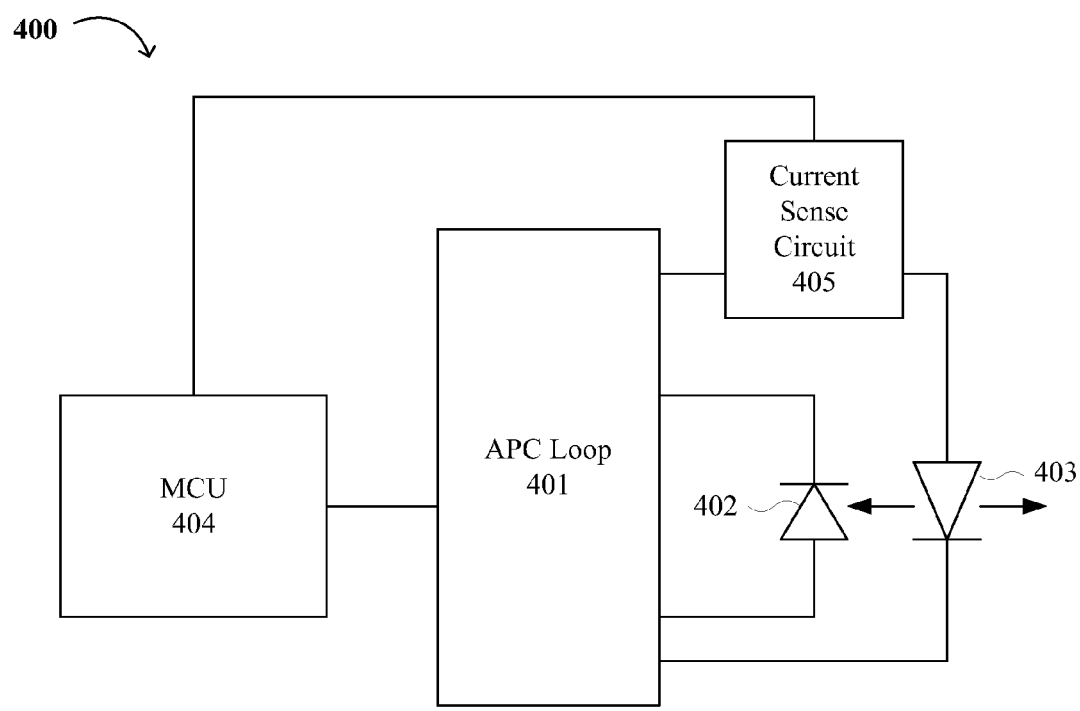
FIG. 4 is a diagram showing an exemplary circuit in accordance with the present invention.

FIG. 4 shows an exemplary optical power monitoring circuit 400 of the present invention comprising an automatic power control (APC) loop 401 and a microcontroller unit (MCU) 404.

Referring to FIGS. 2 and 4, in the APC loop 200 of FIG. 2 and the APC circuit 401 of FIG. 4, the anode of the laser diode 203 or 403 is connected (either directly or through one or more additional circuits) to a positive supply, and the cathode is connected (either directly or indirectly) to a negative supply or circuit ground. The purpose of this connection is to allow the laser to be forward biased in a controlled manner. Moreover, the cathode of the photodetector 202 or 402 that monitors the optical power output from the laser diode 203/403 is connected (either directly or indirectly) to a positive supply, and the anode of the photodetector 202/402 is connected (either directly or indirectly) to a negative supply or circuit ground. The purpose of this connection is to allow the photodetector 202/402 to be reverse-biased so that it can be used as an optical power detector. In all of these cases, additional electronic components, including bipolar transistors, MOSFETs, or other similar electronic components can be used to control the bias current through the laser diode 203/403 and to detect the current from the photodetector 202/402. One important difference between FIG. 2 and FIG. 4 is the addition of a current sense circuit 405 and a MCU (or similar logic) 404 in FIG. 4. The current sense circuit 405 is shown in the positive side (e.g., connected to the anode) of the laser 403 in FIG. 4, but it can also be in the negative side of the laser (e.g., connected to the cathode). In either case, its purpose is to measure the current to the laser diode 403 and report the current to the MCU 404 so that the MCU 404 can use that information to adjust the output power of the laser diode 403 as needed, as will be explained later.

Additionally, a second input/output terminal of the transistor (e.g., the emitter of transistor 213 in FIG. 2) may be grounded, while the control terminal of the transistor (e.g., the base of transistor 213) is connected to an output of the power monitoring feedback loop (e.g., the integral amplifier/operational amplifier/comparator 210 of FIG. 2). A first (e.g., negative) input terminal of the integral amplifier is connected to first terminals of the components in an RC circuit (e.g., capacitor 211 and resistor 212 of FIG. 2). The other terminals of the RC components in the RC circuit may be grounded. A positive input terminal of the PD (202 of FIGS. 2 and 402 in FIG. 4) is connected to the first terminal of the integral amplifier (e.g., amplifier/comparator 210 in FIG. 2). A second (e.g., positive) input terminal 206 of the integral amplifier (e.g., amplifier/comparator amplifier 210) is configured to receive a target power for the laser diode.

There are numerous ways to implement the APC loop, including PNP or NPN transistors, or PMOS or NMOS transistors (e.g., to control the output of the APC loop), with or without operational amplifier(s), current mode vs. voltage mode detectors/comparators/loop elements, etc. A common feature in all of the APC loop implementations is that the optical power of the laser is detected using a reverse-biased photodetector, a negative feedback loop is constructed such that the detected power is compared to a target power, and the bias current of the laser is changed as needed to make the optical power equal to the target power. The measured current is advantageously used to prevent the APC loop from experiencing a thermal-runaway or over-bias situation.

Furthermore, the positive terminal of the laser diode (LD) 403 of FIG. 4 is connected to the current sense circuit 405, which is configured to monitor a bias current (e.g., $I_{BIAS}$ 201 in FIG. 2) to the LD 403 of FIG. 4. In other implementations, the current sense circuit 405 may be placed on the negative side of the laser diode 403. A microcontroller unit (MCU) 404 is connected to the APC loop/circuit 401 via the current sense circuit 405. Thus, the second (e.g., positive) terminal of the integral amplifier or negative feedback loop of the APC is controlled by the MCU 404, and the MCU 404 (or other similar controller or logic) is configured to adjust a target power point 406 in the APC loop, if necessary. Thus, the target power point in the negative feedback APC loop of the present invention is controlled by the MCU 404 and is adjusted according to an algorithm discussed in detail below to prevent the feedback loop from thermal-runaway or an over-bias situation.

In various embodiments of the present invention, if the bias current ($I_{BIAS}$) is monitored as being at or above the alarm threshold $I_{ALM}$, the optical power is reduced by the MCU. If the bias current (IBIAS) is monitored as being at or below the warning threshold $I_{WRN}$, the optical power is increased by the MCU to avoid turning the laser off and/or shutting the laser down.

Figure 5:
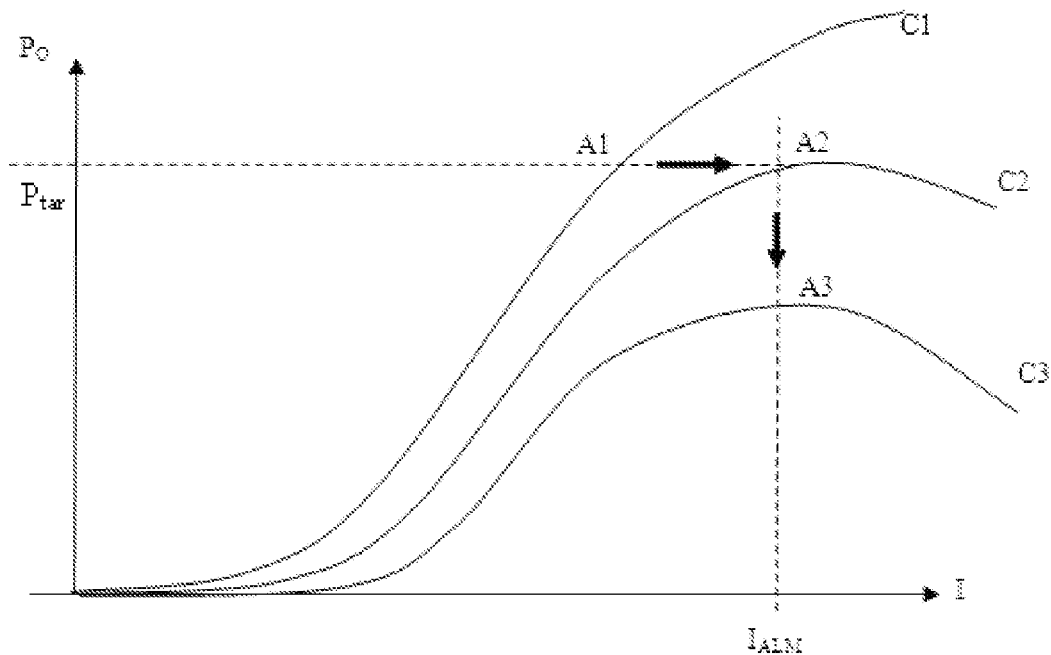
FIG. 5 is a graph showing an exemplary operation of the roll-over prevention circuit in accordance with the present invention.

FIG. 5 illustrates the operation of the roll-over prevention circuit or algorithm (e.g., part of the MCU 404) in the present invention, wherein "$P_o$" represents an output power and "$P_{tar}$" represents a target power. For example, assume the LI curve of the laser at temperature T1 is given by C1, and the APC loop maintains the target power $P_{tar}$ by operating the laser at point A1. Due to the rise in temperature of the LD 403, the LI curve of the laser may degrade from C1 towards C2. The APC circuit maintains the output optical power constant through the negative feedback of the APC loop by increasing the bias current to the laser. Thus, the operating point of the laser (i.e., the bias current) moves from A1 towards A2. Assuming the bias current keeps increasing; the bias current may approach or go above the $I_{ALM}$. Thus, the operating point of the laser reaches A2. The roll-over prevention circuit (e.g., the MCU 404 and current sense circuit 405) and/or algorithm continuously measure the bias current to the laser using the current sense circuit 405. Thus, when the bias current equals or exceeds the $I_{ALM}$, the roll-over prevention circuit (e.g., the MCU 404 and current sense circuit 405) can detect it.

To prevent the laser from further heating up and degrading, the target power point of the APC loop 401 is reduced by a predetermined step or increment by the MCU 404. Since the target power (e.g., the ideal optical output power of the LD 403) is reduced, the bias current will go back below the $I_{ALM}$. If the laser 403 continues to heat up, the LI curve degrades further (e.g., towards C3), and the PD 402 detects a further reduction in laser output power, thereby causing the bias current to increase back to $I_{ALM}$. The MCU 404 will then reduce the target power a little more (e.g., by another predetermined step or increment). This process repeats (i.e., the target power is reduced subsequently by predetermined amounts) as long as the laser LI curve is degrading due to a rise in temperature or other reason. Referring to FIG. 5, the operating point moves down vertically from A2 as needed to maintain the laser bias at or below $I_{ALM}$. Referring back to FIG. 2, it is assumed that C3 is the worst case situation for the laser LI curve, in which case the operating point has moved from A2 to A3. As a result, the laser is prevented from moving into the roll-over region. Note that in the roll-over region, the slope of the LI curve reverses sign or polarity, and becomes negative instead of positive. In a conventional APC circuit, the sign or polarity of the feedback loop will also change from negative to positive, and thus will become unstable. Thus, this circuit and algorithm prevent the feedback loop form becoming unstable and running away.

Figure 6:
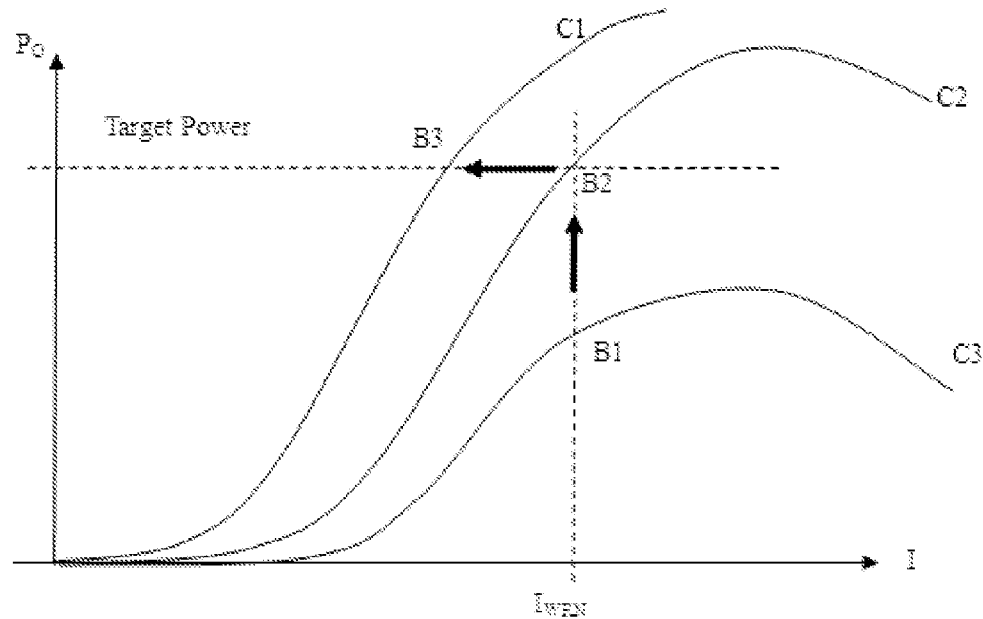
FIG. 6 is a graph showing recovery from roll-over in accordance with the present invention.

FIG. 6 is a diagrammatic drawing of the operation of the present circuit recovering from roll-over. Assuming the laser cools down and the LI curve improves, the APC loop attempts to maintain the power at the same level as A3 in FIG. 5. However, now, because the LI has improved, the same optical power requires less bias current, and thus the bias current through the laser is gradually decreased by the APC loop. During this process, the MCU continues to monitor the bias current, and when the bias current is less than $I_{ALM}$, it does not try to further lower the optical power from the laser. Moreover, as long as the bias current is not less than $I_{ALM}$, it does not try to increase the target power either. If, eventually, the laser is cooled enough such that the bias current goes below $I_{ALM}$, the algorithm reverses the process, and gradually moves the target power back to its original value of $P_{tar}$ as explained below.

Referring back to FIG. 6, as the laser cools further, the operating point of the laser moves to B1, such that the bias current is close to or at $I_{WRN}$. If the laser LI curve improves any further from C3 as a result of the APC loop, the bias current will go below $I_{WRN}$. The current sense circuit and/or the MCU will recognize this, and therefore the MCU increases the target power of the APC loop by one step. As the LI curve of the laser continues to improve, each time the bias current goes below $I_{WRN}$, the MCU will increase the target power by one step, effectively moving the operating point vertically up, until eventually, it reaches the point B2, corresponding to the LI curve C2, where the target power reaches its original value of $P_{tar}$. If the laser improves any further, for example to C3, the operating point will move to B3 as a result of the normal operation of the APC loop.

More specifically, the warning threshold current $I_{WRN}$ and the alarm threshold current $I_{ALM}$ have values determined in accordance with the individual laser and the application by the designer(s). In a conventional method, the alarm threshold current $I_{ALM}$ is configured to be lower than or to approach the maximum current in the common operation mode of the laser diode, and the $I_{WRN}$ can be lower than the $I_{ALM}$ by 2-20 mA (e.g., the alarm current in the common operation mode of the laser diode is the current at which the optical power output decreases as the bias current goes above the maximum current in the normal operation of the laser). Thus, hysteresis can be provided in the circuits using $I_{ALM}$ and $I_{WRN}$, and oscillation can be prevented thereby. For example, in Fabry-Perot (FP) lasers and distributed feedback (DFB) lasers, which are commonly used in transmissions over optical fiber, the $I_{WRN}$ can be around 85-100 mA, and the $I_{ALM}$ can be between about 90 and 100 mA. Generally, $I_{WRN} < I_{ALM}$.

Figure 7:
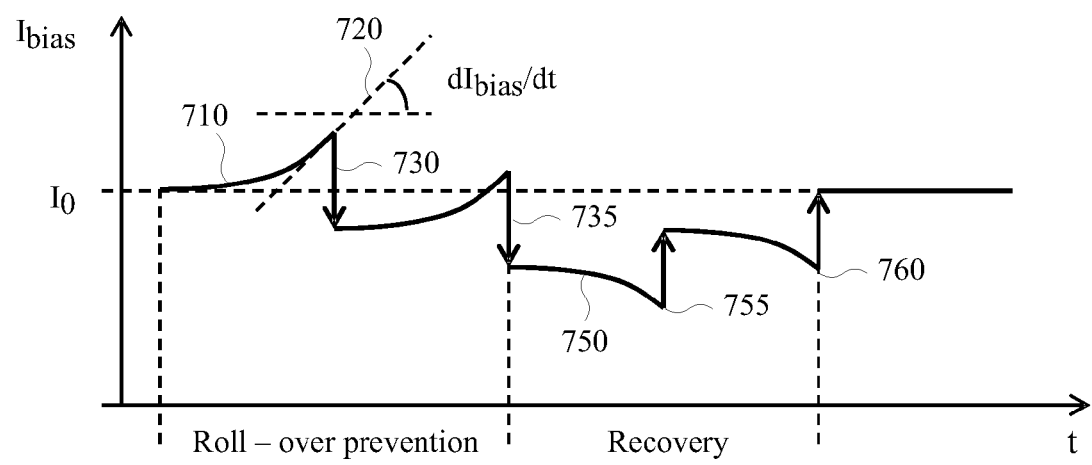
FIG. 7 is a graph showing recovery from roll-over in accordance with the present invention, in which the MCU monitors a rate of change of the bias current $I_{BIAS}$ ($dI_{BIAS}/dt$).

FIG. 7 illustrates the operation of the roll-over prevention circuit and algorithm in the present invention, in which the MCU monitors a rate of change of the bias current $I_{BIAS}$ ($dI_{BIAS}/dt$). The original bias current of the APC loop is represented by "$I_0$". The left side of FIG. 7 shows a degradation condition where the slope of $I_{BIAS}$ with time ($dI_{BIAS}/dt$) increases. When the bias current 710 reaches a threshold 720, the power is reduced or decreased by one step each time to prevent roll-over. The step-wise reduction in power causes or results in a drop 730, 735 in the bias current.

After the drop 735 in bias current at time 740, the laser is recovering, which causes the reverse to happen, in which the power is maintained, requiring less bias current 750. Thus, the bias current is reduced. When the bias current reaches the corresponding threshold for decreases if bias current (e.g., at 755), the power is increased by one step up towards the original value of the bias current $I_0$. The process repeats (e.g., at 760) until the bias current and consequently power is back at the original value of the bias current.

Generally, when a laser approaches a thermal runaway situation in a closed loop APC configuration, the bias current starts to increase, even when the absolute value of the bias current has not exceeded $I_{th}$ or $I_{ALM}$. As a result, by monitoring the $dI_{BIAS}/dt$ and comparing it with separate alarm and warning threshold values for the rate of change, the circuit can detect the onset of a thermal run-away situation.

Typical values for the threshold values of rate of change in the bias current vary from one application to the other. For example, the alarm value can range from about 2-20 mA/min, and the warning value can range from about −2 to about −20 mA/min. Once the rate of change of the bias current exceeds the alarm value, the MCU will reduce power, and will prevent the laser and the APC loop from approaching a thermal runaway situation. The MCU will continue to monitor the $dI_{BIAS}/dt$. If the rate of change of the bias current remains larger than the threshold value, then the laser is still close to an unstable operation region. Thus, the MCU can reduce the power by another step. This process continues until the rate of change of the bias current is no longer above the alarm threshold value. At this point, the laser is stabilized. The recovery from this process may occur when the rate of change of the bias current goes below the warning threshold.

For example, the warning threshold is negative (e.g., the bias current is decreasing with time for a given target power). The MCU will increase the power one step back towards the original value of the bias current. If the laser is in a normal operating mode, the rate of change of the bias current may remain negative. Thus, this process generally continues until the original power is reached.

As a result, the present invention monitors both the absolute value of the bias current and the rate of change of the bias current with time. A warning threshold value and an alarm threshold value are defined (e.g., a total of 4 values) for each parameter being monitored (e.g., the absolute value of the bias current and the rate of change of the bias current). By constantly monitoring the bias current and the rate of change of the bias current, the circuit prevents the APC loop from approaching or entering thermal instability.

To summarize, the roll-over prevention circuit constantly monitors the bias current and the rate of change of the bias current, and if the bias current goes above the $I_{ALM}$, the target power is reduced (e.g., periodically) by the MCU to prevent the bias current from exceeding the alarm threshold value. If the laser cools down and the bias current falls below the warning threshold value, the process is reversed, and the MCU increases the target power. The process is repeated until the original or normal optical output power is achieved again. The periodicity (e.g., how often the roll-over prevention circuit adjusts the power) and also the power step size (e.g., how much the target power is reduced or increased each time) can be varied depending on the application. For example, the periodicity may be in the range of once every 100 ms, and the power step size may be reduced or increased each time by 0.1 dBm.

Conclusion/Summary

Thus, the present invention provides an optical power monitoring circuit comprising an automatic power control (APC) loop and a microcontroller unit (MCU). Furthermore, the present optical power monitoring circuit advantageously integrates a current sensing circuit with the MCU to monitor a bias current. In order to overcome the shortcomings in existing technology, the present optical power monitoring circuit and monitoring method advantageously maintain an output optical power and prevent thermal (or other kinds of) runaway situations and/or laser diodes from rolling over and/or shutting down, which can result in a hard failure and/or shutdown of the system, and/or cause damage to the system's hardware.

The foregoing descriptions of specific embodiments of the present invention have been presented for purposes of illustration and description, and many modifications and variations are possible in light of the above teachings. The descriptions are not intended to limit the invention to the above described embodiments. On the contrary, the invention is intended to cover new feature or any combination thereof, as well as steps of any new method or procedure or any new combination thereof, that may be included within the spirit and scope of the specification. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An optical power monitoring circuit, comprising:
   an automatic power control (APC) loop, comprising (i) a laser diode connected to a current sense circuit, and (ii) a feedback loop; and
   a microcontroller unit (MCU) configured to (i) monitor a bias current via the current sense circuit, (ii) decrease a target power of the APC loop when the bias current exceeds an alarm threshold, and (iii) increase the target power of the APC loop when the bias current is lower than a warning threshold.

2. The optical power monitoring circuit of claim 1, wherein the MCU is configured to monitor a DC bias current in the laser diode in real time and regulate a target optical power of the laser diode to keep the laser diode operating in a normal operating region.

3. The optical power monitoring circuit of claim 2, wherein the APC loop maintains the optical power by adjusting or monitoring the bias current in the laser diode when the laser diode is operating.

4. The optical power monitoring circuit of claim 1, wherein the MCU is further configured to monitor a rate of change of the bias current with time, decrease a target power of the laser diode when the rate of change of the bias current per unit time equals or exceeds an alarm threshold, and increase the target power of the laser diode when the rate of change of the bias current per unit time is less than or equal to a warning threshold.

5. The optical power monitoring circuit of claim 4, wherein the MCU decreases the target optical power when the rate of change of the bias current with time exceeds an alarm threshold.

6. The optical power monitoring circuit of claim 4, wherein the MCU increases the target power when the rate of change of the bias current with time is lower than a warning threshold.

7. The optical power monitoring circuit of claim 6, wherein the warning threshold is lower than the alarm threshold by 2-20 mA.

8. The optical power monitoring circuit of claim 6, wherein the warning threshold is 85-100 mA.

9. The optical power monitoring circuit of claim 1, wherein the alarm threshold is an absolute maximum operating current of the laser diode.

10. The optical power monitoring circuit of claim 1, wherein the warning threshold is a current below which the laser diode operates normally.

11. The optical power monitoring circuit of claim 1, wherein the alarm threshold is lower than or approaching a maximum operating current.

12. The optical power monitoring circuit of claim 11, wherein the alarm threshold is 90-100 mA.

13. A method of monitoring an optical output circuit, comprising:
   monitoring or sensing a bias current and a rate of change of the bias current to a laser diode;
   determining a rate of change of the bias current per unit time;
   monitoring or detecting an output power of the laser diode;
   decreasing a target power of the laser diode when the bias current equals or exceeds an alarm threshold; and
   increasing the target power of the laser diode when the bias current is less than or equal to a warning threshold.

14. The method of claim 13, wherein the bias current is monitored in real time.

15. The method of claim 13, further comprising comparing the output power to the target power.

16. The method of claim 13, wherein decreasing the target power comprises decreasing the bias current to the laser diode.

17. The method of claim 13, wherein the alarm threshold is a maximum current in a common operation mode of the laser diode, and the warning threshold is a current below which the laser diode operates normally.

18. The method of claim 13, further comprising decreasing a target power of the laser diode when a rate of change of the bias current per unit time equals or exceeds an alarm threshold, and increasing the target power of the laser diode when the rate of change of the bias current per unit time is less than or equal to a warning threshold.

19. The method of claim 18, wherein the warning threshold is (−2)-(−20) mA/minute, and the alarm threshold is 2-20 mA/minute.

20. The method of claim 13, wherein the alarm threshold is lower than or approaching a maximum operating current of the laser diode.

21. The method of claim 13, wherein the alarm threshold is 90-100 mA, the warning threshold is 85-100 mA, and the warning threshold is lower than the alarm threshold.

22. The method of claim 21, wherein the warning threshold is lower than the alarm threshold by 2-20 mA.

* * * * *